United States Patent
Makino

(10) Patent No.: US 6,635,935 B2
(45) Date of Patent: Oct. 21, 2003

(54) SEMICONDUCTOR DEVICE CELL HAVING REGULARLY SIZED AND ARRANGED FEATURES

(75) Inventor: Hiroshi Makino, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/818,907

(22) Filed: Mar. 28, 2001

(65) Prior Publication Data

US 2002/0003270 A1 Jan. 10, 2002

(30) Foreign Application Priority Data

Jul. 10, 2000 (JP) .......................................... 2000-207911

(51) Int. Cl.[7] .......................... H01L 29/76; H01L 29/94; H01L 31/062
(52) U.S. Cl. ........................ 257/369; 257/370; 257/371; 257/372; 257/376; 257/377; 257/206; 257/390; 257/401
(58) Field of Search ................................. 257/369–377, 257/206, 390, 401

(56) References Cited

U.S. PATENT DOCUMENTS

| | | | | |
|---|---|---|---|---|
| 4,701,777 A | * | 10/1987 | Takayama et al. ........... | 257/206 |
| 4,780,753 A | * | 10/1988 | Ohkura et al. ............... | 257/369 |
| 5,031,018 A | * | 7/1991 | Shirato et al. ............... | 257/369 |
| 5,079,614 A | * | 1/1992 | Khatakhotan ............... | 257/369 |
| 5,410,161 A | * | 4/1995 | Narita ........................... | 257/41 |
| 5,416,619 A | * | 5/1995 | Koike ........................... | 349/42 |
| 5,781,253 A | * | 7/1998 | Koike et al. ................... | 349/40 |
| 5,841,153 A | * | 11/1998 | Kuriyama et al. ............. | 257/69 |
| 5,847,429 A | * | 12/1998 | Lien et al. .................... | 257/355 |
| 5,866,933 A | * | 2/1999 | Baukus et al. ............... | 257/368 |
| 5,889,310 A | * | 3/1999 | Terashima et al. .......... | 257/409 |
| 5,920,089 A | * | 7/1999 | Kanazawa et al. .......... | 257/202 |
| 6,067,249 A | * | 5/2000 | Lee et al. ............... | 365/185.05 |
| 6,084,798 A | * | 7/2000 | Lee ........................ | 365/185.03 |

FOREIGN PATENT DOCUMENTS

JP          9-289251          11/1997

OTHER PUBLICATIONS

Principles of CMOS VLSI Design, Neil H. E. Weste and Kamran Eshraghian, 1993, pp. 283–290.

* cited by examiner

*Primary Examiner*—Amir Zarabian
*Assistant Examiner*—Ida M. Soward
(74) *Attorney, Agent, or Firm*—McDermott, Will & Emery

(57) ABSTRACT

In a semiconductor device, first gate electrodes contributing to transistor operations and second gate electrodes not contributing to the transistor operations each have the same gate length, share the common gate length direction, and are arranged in the same pitch. The first gate electrodes and the second gate electrodes are all made to extend, in the gate width direction, beyond the longest active region width. With such a configuration, it is possible to provide a semiconductor device having a pattern structure that will not cause performance degradation of transistors when designing a semiconductor integrated circuit within a semiconductor device.

15 Claims, 12 Drawing Sheets

SEMICONDUCTOR DEVICE CELL HAVING REGULARLY SIZED AND ARRANGED FEATURES

BACKGROUND OF THE INVENTION

1. Field of the Invention

The present invention relates to semiconductor devices, and more particularly, to a pattern configuration of a semiconductor device with a plurality of gate electrodes formed on a transistor forming region and arranged in one direction.

2. Description of the Background Art

Generally in designing a semiconductor integrated circuit within a semiconductor device, the entire semiconductor integrated circuit is not constructed at one time. Rather, a number of functional blocks, called standard cells, are combined under a prescribed rule to construct the semiconductor integrated circuit. Such method of combining a plurality of standard cells is called "cell-based design".

The semiconductor integrated circuits of such cell-based design consisting of standard cells include a wide variety of circuits, from basic gate circuits with simple structures, such as inverter circuits, AND circuits and NAND circuits, more complex ones like flip-flop circuits, to relatively large sized block circuits like adders and so on, which are utilized as necessary.

As a rule of the cell-based design, unification in heights of standard cells, thicknesses of power supply lines, locations of wiring and input/output pins and others is attempted so as to place neighboring standard cells at a shortest possible distance from each other. As such standard cells, the one having a layout pattern as shown in FIG. 13, for example, has been utilized.

FIG. 13 schematically shows an underlying structure of a transistor portion in a conventional standard cell. A cell frame 21 delimited by a two-dotted, dashed line represents the standard cell region. This standard cell is provided with gate electrodes 1, 2, 3 and 4 arranged in a gate length direction, and active regions 5, 6 and 7 formed by introducing impurity ions into a silicon substrate by ion implantation.

Gate electrodes 1–4 run across and extend beyond active regions 5–7. Interconnection portions 15, 16, 17 and 18 in prescribed shapes are each provided at either end in a gate width direction of respective one of gate electrodes 1–4.

Regions bounded by active regions 5–7 and gate electrodes 1–4 define source/drain regions 8–14 of transistors. For example, a transistor with gate electrode 1 has source/drain regions 8, 9. A transistor with gate electrode 2 has source/drain regions 9, 10. These two transistors share source/drain region 9. Further, a transistor having gate electrode 3 is provided with source/drain regions 11, 12. A transistor having gate electrode 4 is provided with source/drain regions 13, 14.

Interconnection portions 15–18 are provided so as to electrically connect gate electrodes 1–4 to interconnections (not shown) which are to be placed in a layer overlying gate electrodes 1–4. Normally, contact holes for connection between these interconnection portions and the interconnections in the upper layer are provided, so that gate electrodes 1–4 and the upper-layer interconnections are connected. Likewise, source/drain regions 8–14 are connected to the upper-layer interconnections by providing contact holes in those regions.

Thus, the gate electrode and the source/drain regions of each transistor are electrically connected to the interconnections in the upper layer, so that a logic circuit is constructed. Here, because of the configuration of the standard cell as described above, the size of the transistors can be set arbitrarily by changing the dimensions in the gate width direction of active regions 5–7 and gate electrodes 1–4. As a result, it is readily possible to optimize the performance of the semiconductor integrated circuit.

On the contrary, in a so-called gate array structure, a basic size of transistor is predetermined, and the transistor size is only adjusted by an integer multiple thereof. This makes it difficult to optimize the circuit. Therefore, the cell-based design has an advantage that it can implement LSI (large-scale integration) exhibiting higher performance than in the gate array design.

In recent years, however, miniaturization of elements and interconnections has been drastically advanced and the pattern dimension has become smaller than the wavelength of light source of an exposure system. This causes variation in finished dimension of a pattern after exposure, which now is an innegligible problem. Specifically, in the case of exposure of a regular pattern, elements can be finished in approximately the same size. However, in the case of exposure of an irregular pattern for, e.g., the conventional gate electrodes as shown in FIG. 13, irregular interference of exposure light radiated from the exposure system will result in gate electrodes with their finished dimensions varying from one another.

Taking notice of gate electrode 2 in FIG. 13, for example, it is about twice the length of gate electrode 1 residing on its left side. In other words, gate electrode 1 extends along gate electrode 2 only half the way. In this case, finished dimension of gate electrode 2 in a portion adjacent to gate electrode 1 will differ from that in the remaining portion. Generally in a gate electrode, the gate length determines the performance of the transistor. If the gate length is longer than a designed value, load driving capability during an ON state of the transistor will decrease, thereby degrading the driving speed of the transistor. Conversely, if the gate length is shorter than the designed value, a leakage current during an OFF state of the transistor will increase, thereby increasing the power consumption.

As described above, in the case of cell-based design, if gate electrodes have an irregular pattern, their finished dimensions will vary from one another. This leads to performance degradation, such as a slower operating speed, increased power consumption and the like, of transistors within the semiconductor integrated circuit.

SUMMARY OF THE INVENTION

The present invention is directed to solve the above-described problems. An object of the present invention is to provide a semiconductor device having a pattern structure that can suppress performance degradation of transistors.

The semiconductor device according to the present invention includes: a transistor forming region having a plurality of source/drain regions formed on a semiconductor substrate and a plurality of gate electrodes arranged in a first direction, each having a gate width direction that matches a second direction orthogonal to the first direction; and a plurality of field effect transistors each formed of one of the plurality of gate electrodes and two of the plurality of source/drain regions. The plurality of field effect transistors include at least two kinds of such field effect transistors that are different in active region widths corresponding to lengths of the plurality of source/drain regions along the second direction. Each of the plurality of gate electrodes is made to have a gate width that is greater than the longest active region width.

As the gate width of each gate electrode is made greater than the longest active region width as described above, it is ensured that every couple of gate electrodes adjacent to each other have their sides facing with each other within the active region width. Thus, adverse effects of irregular interference of the exposure light can be suppressed, so that it becomes possible to equalize the finished dimension of each gate electrode.

As a preferred embodiment of the present invention, each of the plurality of gate electrodes is provided such that every distance between opposing sidewalls of two adjacent gate electrodes is approximately equal to each other. Still preferably, the plurality of gate electrodes have the same gate length.

With such a configuration, gate electrodes approximately in identical shapes are arranged regularly in the first direction. Thus, at the exposure step in the pattern formation of the gate electrodes, adjacent gate electrode patterns come to affect to each other in an equal manner, so that it becomes possible to obtain an equal finished dimension for every gate electrode. As a result, each gate electrode is fabricated in the same shape, so that the semiconductor device can attain and exert characteristics as designed.

As a still preferred embodiment of the present invention, the semiconductor device includes a plurality of transistor forming regions, which are arranged side by side in the second direction.

Even when multiple transistor forming regions are arranged in the second direction, each gate electrode in each transistor forming region is made the same in shape, so that it becomes possible to allow the semiconductor device to realize characteristics as designed.

As another preferred embodiment of the present invention, the semiconductor device includes a plurality of transistor forming regions, which are arranged in the first direction. A first auxiliary pattern electrode is provided between the transistor forming regions. The first auxiliary pattern electrode is made to have the same gate length as the gate electrodes in the transistor forming regions. It is also placed such that a respective distance between the first auxiliary pattern electrode and each of the closest gate electrodes in the respective transistor forming regions is made equal to a pitch in which the gate electrodes in the transistor forming regions are arranged in the gate length direction. Respective ends in the gate width direction of the first auxiliary pattern electrode are made to align with or extend beyond the respective ends of the gate electrodes in the second direction.

As described above, in the case where the transistor forming regions are arranged side by side in the first direction, the first auxiliary pattern electrode almost in the same shape as each gate electrode is provided between the transistor forming regions in the same pitch as the gate electrodes. Thus, all the gate electrodes are arranged regularly in the first direction. Accordingly, at the exposure step in the pattern formation of the gate electrodes, adjacent gate electrodes come to affect to each other in an equal manner, which results in equal finished dimension of each gate electrode. As a result, each gate electrode is fabricated in the same shape, so that it becomes possible to allow the semiconductor device to realize characteristics as designed.

Further, as a preferred embodiment of the present invention, a second auxiliary pattern electrode is provided outside the outermost gate electrode in the transistor forming region at its side not facing another transistor forming region. The second auxiliary pattern electrode is made to have the same gate length as the gate electrodes, and arranged in the same pitch as the gate electrodes in the first direction. Respective ends of the second auxiliary pattern electrode in the second direction are made to align with or extend beyond the respective ends of the gate electrodes in the second direction.

Thus, the second auxiliary pattern electrode is provide outside the transistor forming region on its side not facing another transistor forming region. Accordingly, at the time of exposure in the pattern formation, conditions are made equal for the gate electrode that is located at the outermost part of the region and for the gate electrode that is located in the center of the region. Thus, it becomes possible to equalize the finished dimension of every gate electrode. As a result, the gate electrodes are all fabricated in the same shape, so that the semiconductor device is able to attain and exert characteristics as designed.

Further, as a preferred embodiment of the present invention, a gate interconnection portion in an arbitrary shape is provided at an end in the second direction of a selected gate electrode.

Still preferably, the plurality of gate electrodes include at least one electrically independent gate electrode, and the remaining gate electrode is provided with the interconnection portion connected thereto which has a width in the first direction that is greater than that of the gate electrode.

As a still preferred embodiment of the present invention, the gate electrodes within the transistor forming region include a first gate electrode that contributes to an operation of the semiconductor device, and a second gate electrode that does not contribute to the operation of the semiconductor device.

Thus, by mixing the first and second gate electrodes, at the exposure step in the pattern formation of the gate electrodes, the adjacent gate electrodes come to affect to each other in an equal manner. Thus, it becomes possible to equalize the finished dimension of every gate electrode. As a result, the gate electrodes are fabricated in the same shape, so that the semiconductor device is allowed to realize characteristics as designed.

Further, as a preferred embodiment of the present invention, a selected gate electrode is formed of a single member from its one end to the other end in the second direction. Still further, a selected gate electrode is divided into at least two parts in the second direction. Even when such configurations are employed, gate electrodes approximately in the same shape can be fabricated. Thus, it becomes possible to bring out from the semiconductor device the characteristics as designed.

As a still preferred embodiment of the present invention, every distance between opposing sidewalls of two adjacent gate electrodes is made the same.

With such a configuration, at the exposure step in the pattern formation of the gate electrodes, it becomes possible to equalize the effects of opposing sidewalls of the adjacent gate electrodes being given to each other. Thus, each gate electrode is fabricated with finished dimension as designed. As a result, the semiconductor device that can bring out characteristics as designed is realized.

As a preferred embodiment of the present invention, the active regions are provided such that every distance between two adjacent active regions in the first direction becomes the same.

With such a configuration, at the time of exposure in the pattern formation of the active regions, it becomes possible to equalize the effects of the adjacent active regions being given to each other. Each active region can thus be fabricated with a finished dimension as designed. As a result, the semiconductor device that can bring out characteristics as designed is realized.

Further, as a preferred embodiment of the present invention, one such transistor forming region is formed in a standard cell.

According to another aspect of the semiconductor device of the present invention, a plurality of the semiconductor devices as described above are arranged in rows and columns to construct a semiconductor integrated circuit. Therefore, it becomes possible to realize a semiconductor device with excellent reliability in its operating characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
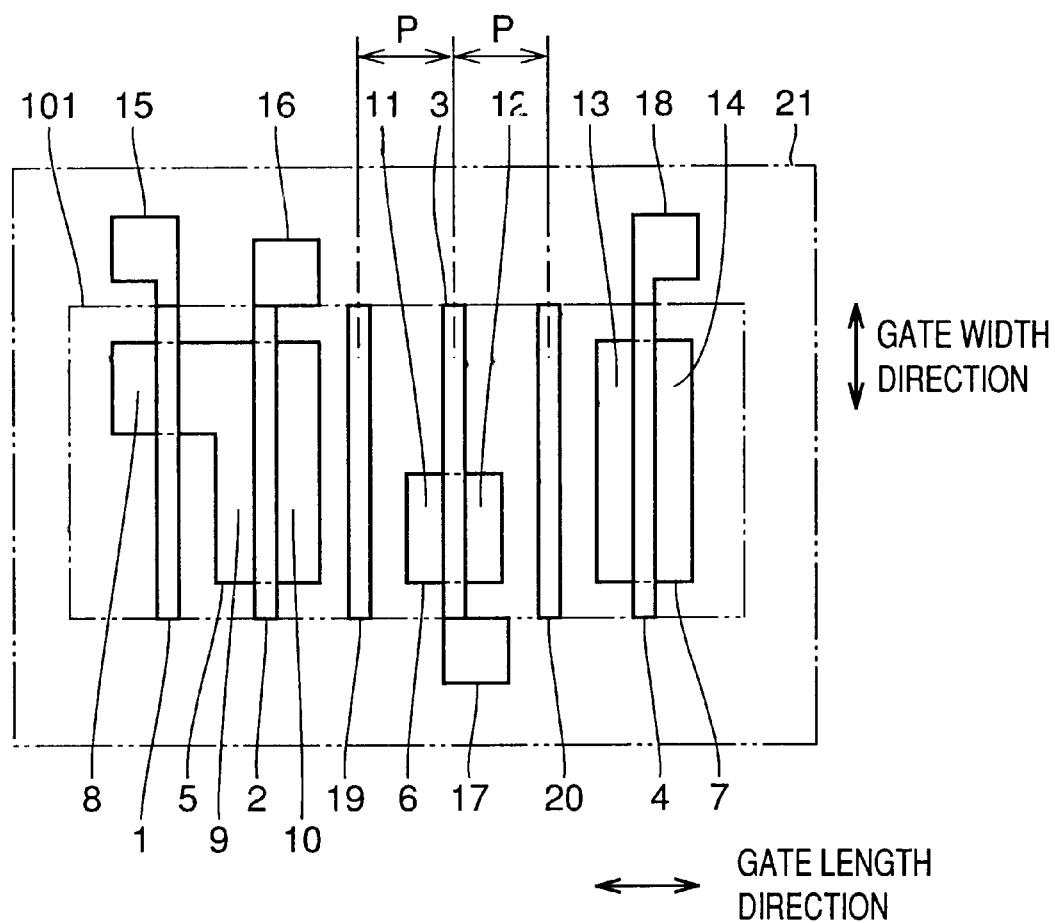
FIGS. 1–3 are top plan views schematically showing standard cell structures according to first through third embodiments, respectively, of the present invention.

Hereinafter, embodiments of the semiconductor device according to the present invention will be described with reference to drawings. Each drawing schematically illustrates an underlying structure of a transistor portion in a respective standard cell. In each drawing, for the sake of clarity, a cell frame representing the standard cell region and a transistor forming region included therein are each delimited by a two-dotted, dashed line. Further, in FIGS. 1–12, portions the same as or corresponding to those in the conventional standard cell shown in FIG. 13 are denoted by same reference characters, and detailed description thereof is not repeated.

Further, in the following description, a first direction along the gate length of the gate electrode provided in the standard cell is called a "gate length direction", and a second direction orthogonal to the gate length direction is called a "gate width direction".

First Embodiment

Configuration

A structure of the standard cell according to the first embodiment will now be described. Referring to FIG. 1, a transistor forming region 101 provided within cell frame 21 includes first gate electrodes 1–4 that contribute to transistor operations, active regions 5–7, and second gate electrodes 19, 20 that do not contribute to the transistor operations.

First gate electrodes 1–4 and second gate electrodes 19, 20 each have the same gate length. They are made to have a common gate length direction such that they all become exactly parallel with each other. Further, they are all arranged in the same pitch. Here, the pitch means, as shown by a reference character "P" in FIG. 1, a distance between centerlines of two adjacent gate electrodes. In addition, both ends in the gate width direction of first gate electrodes 1–4 and second gate electrodes 19, 20 are substantially aligned on the common imaginary lines at respective ends. First gate electrodes 1–4 and second gate electrodes 19, 20 of the present embodiment are each made of the same material with the same length from one end to the other end in the gate width direction.

Active regions 5, 6 and 7 are provided below first gate electrodes 1–4, and transistors each including respective one of the first gate electrodes are formed. Active region 5 has two kinds of widths in the gate width direction. First gate electrode 1 is provided such that it extends beyond the greater active region width.

The transistor size is determined by the size of active regions 5–7, which is different from the case of gate array design. Interconnection portions 15, 16, 17 and 18 extending from respective gate electrodes 1–4 may be formed in arbitrary shapes outside the transistor forming region 101 as required, as in the prior art. Interconnection portions 15, 16, 17 and 18 of the present embodiment are each arranged to have a width in the gate length direction that is greater than the gate length of each gate electrode.

Function and Effect

According to the standard cell with the configuration as described above, first gate electrodes 1–4 and second gate electrodes 19, 20 all in the same shape are regularly arranged in the gate length direction. Therefore, at the exposure step in the pattern formation of the gate electrodes, influences from neighboring gate electrode patterns are made equal to each other, so that it becomes possible to equalize the finished dimension of each gate electrode. As a result, degradation of operating speed as well as increase of power consumption in the semiconductor integrated circuit due to variation in finish of the gate electrodes can be prevented.

In the present embodiment, each transistor may be of a pMOS or nMOS type. In either case, same functions and same effects are realized. In addition, the description above is about the case where first gate electrodes 1–4 and second gate electrodes 19, 20 each in the same shape are mixed together. However, even if all the gate electrodes are the first gate electrodes contributing to transistor operations, the same functions and same effects can be obtained.

Second Embodiment

Configuration

Figure 2:
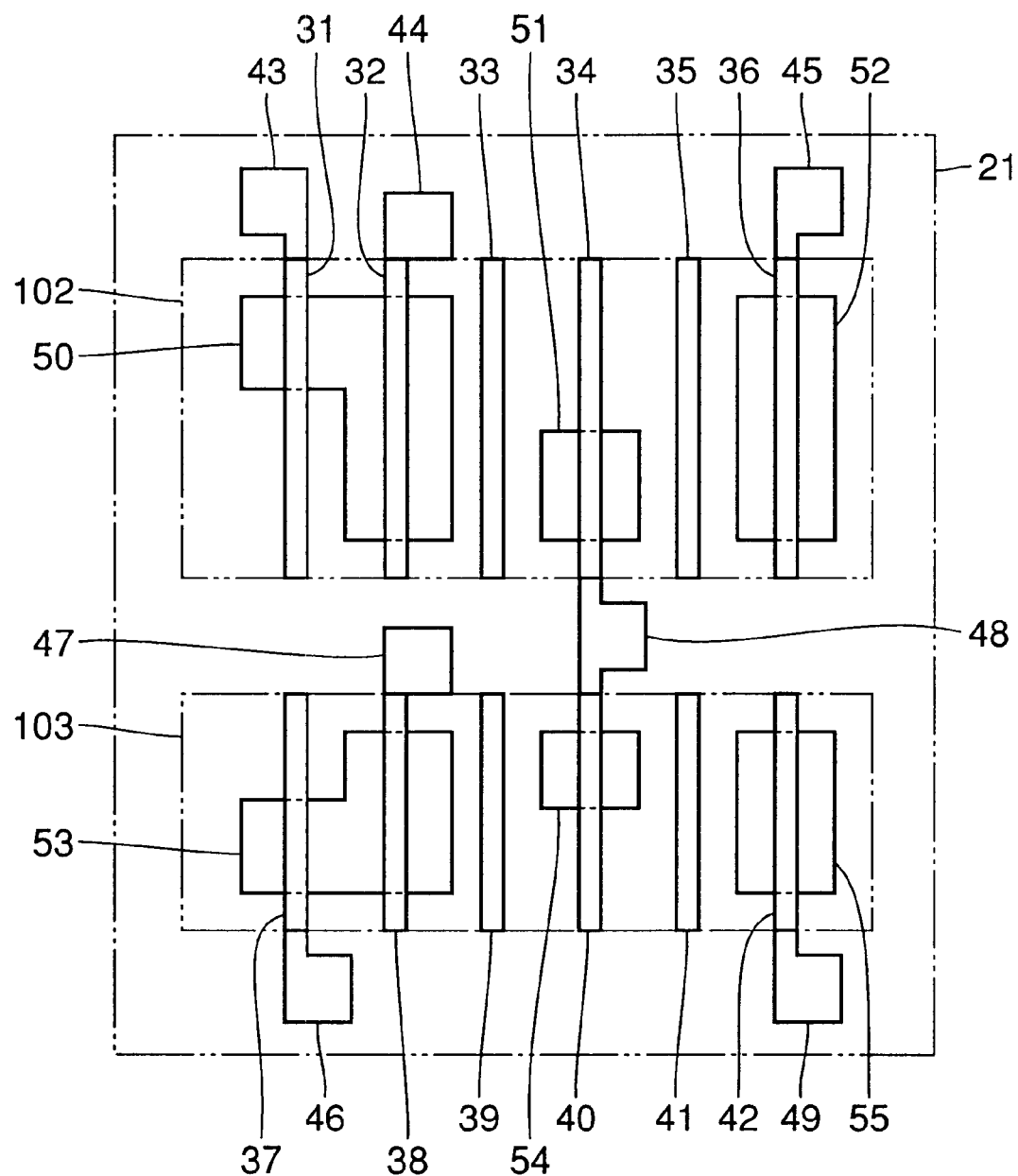

A structure of the standard cell according to the second embodiment will now be described. Referring to FIG. 2, the standard cell structure of the present embodiment includes, in one cell frame 21, two transistor forming regions 102 and 103 arranged side by side in the gate width direction.

Transistor Forming Region 102

Transistor forming region 102 includes therein first gate electrodes 31, 32, 34, 36 contributing to transistor operations, and second gate electrodes 33, 35 not contributing to the transistor operations. First gate electrodes 31, 32, 34, 36 and second gate electrodes 33, 35 each have the same gate length. They are arranged to have the common gate length direction, and are arranged in the same pitch.

Further, first gate electrodes 31, 32, 34, 36 and second gate electrodes 33, 35 are arranged such that they all extend in the gate width direction to reach and align on approximately the same imaginary lines at their respective ends. First gate electrodes 31, 32, 34, 36 and second gate electrodes 33, 35 of the present embodiment are each made of the same material from one end to the other end in the gate width direction.

Active regions 50, 51, 52 are provided below first gate electrodes 31, 32, 34 and 36, and transistors each including respective one of these first gate electrodes are formed. In the gate width direction, active region 50 has two kinds of widths and first gate electrode 31 is provided such that it extends beyond the greater active region width.

The size of transistor is determined by the size of active regions 50–52. In this point, this design is different from the gate array design. Further, as in the conventional case, interconnection portions 43, 44, 45 and 48 extending from first gate electrodes 31, 32, 34 and 36 can be provided in arbitrary shapes outside the transistor forming region 102 as necessary. Interconnection portions 43, 44, 45 and 48 of the present embodiment are arranged such that they each have a width, in the gate length direction, that is greater than the gate length of each gate electrode.

Transistor Forming Region 103

Transistor forming region 103 is provided with first gate electrodes 37, 38, 40, 42, which contribute to transistor operations, and second gate electrodes 39, 41, which do not contribute to the transistor operations. First gate electrodes 37, 38, 40, 42 and second gate electrodes 39, 41 each have the same gate length, are arranged to have the same gate length direction, and are arranged in the same pitch.

Further, respective ends of first gate electrodes 37, 38, 40, 42 and second gate electrodes 39, 41 in the gate width direction are arranged to approximately align on the same imaginary lines, respectively. First gate electrodes 37, 38, 40, 42 and second gate electrodes 39, 41 of the present embodiment are made of the same material from one end to the other end in the gate width direction.

Note that each gate width of first gate electrodes 37, 38, 40, 42 and second gate electrodes 39, 41 in transistor forming region 103 is made smaller than that of first gate electrodes 31, 32, 34, 36 and second gate electrodes 33, 35 in transistor forming region 102.

Active regions 53, 54, 55 are provided below first gate electrodes 37, 38, 40 and 42, and transistors each including respective one of these first gate electrodes are formed. In the gate width direction, active region 53 has two kinds of widths. First gate electrode 37 is arranged to extend in the gate width direction beyond the greater active region width.

The transistor size is determined by the size of active regions 53–55, which is different from the case of the gate array design. Further, as in the conventional case, interconnection portions 46, 47, 48, 49 extending from first gate electrodes 37, 38, 40, 42 can be provided in arbitrary shapes, as necessary, outside transistor forming region 103. Interconnection portions 46, 47, 48 and 49 of the present embodiment are each arranged to have a width greater than the gate length of each gate electrode. Interconnection portion 48 is shared by first gate electrodes 34 and 40.

Function and Effect

According to the standard cell with the configuration as described above, even if two transistor forming regions 102 and 103 are arranged within one cell frame 21, it becomes possible to obtain the same functions and effects as in the first embodiment.

Further, by providing two separate transistor forming regions in the gate width direction as in the present embodiment, it becomes possible, for example, to form pMOS transistors and NMOS transistors separately from each other in the respective regions. This simplifies the layout. In addition, transistor sizes can be set individually for the two transistor forming regions, so that it becomes possible to reduce the size of extra gate regions other than the gate regions on the active regions, as of gate electrodes 34 and 40. This results in reduction of parasitic capacitance. Accordingly, a semiconductor integrated circuit operating more rapidly and consuming less power can be realized.

Although the present embodiment has been described taking the case in which two transistor forming regions are arranged side by side in the gate width direction, even in the case where three or more such regions are provided, the same functions and effects can be obtained.

In addition, although the gate widths of the gate electrodes in transistor forming regions 102 and 103 are differentiated from each other in the description above, even if they are made equal to each other, the same functions and effects can be attained.

Third Embodiment

Configuration

Figure 3:
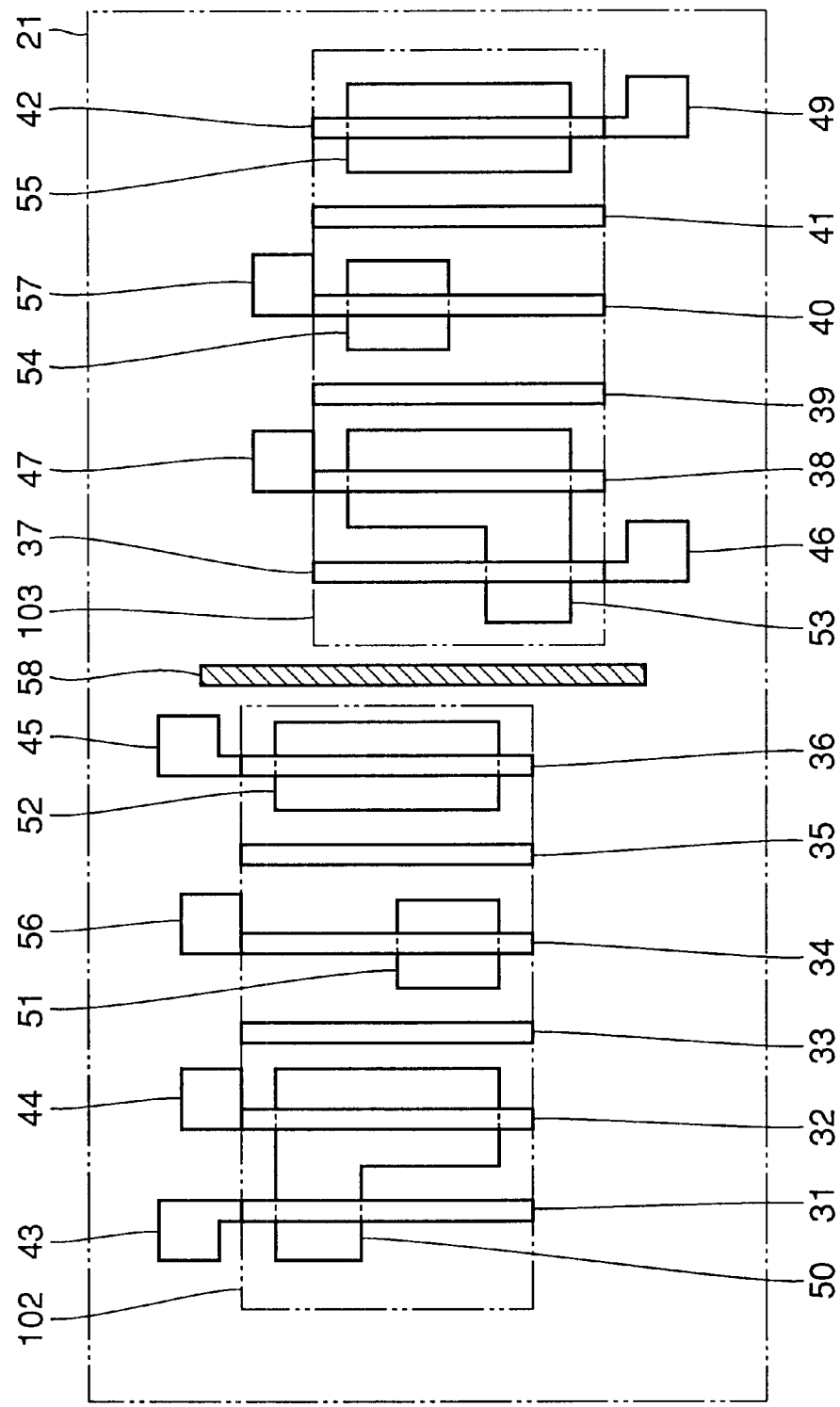

FIG. 3 shows a semiconductor device of the third embodiment. Referring to FIG. 3, the standard cell structure according to the present embodiment includes, in one cell frame 21, transistor forming region 102 and transistor forming region 103 that are arranged side by side in the gate length direction. Further, a first auxiliary pattern electrode 58 is provided between transistor forming regions 102 and 103.

Transistor Forming Regions 102, 103

Basic configurations of transistor forming regions 102 and 103 are the same as those in the second embodiment, except that first gate electrode 34 in transistor forming region 102 is provided with an interconnection portion 56, and first gate electrode 40 in transistor forming region 103 is provided with an interconnection portion 57, and that every gate electrode provided in transistor forming regions 102 and 103 has the same gate width. Interconnection portions 56, 57 each are arranged to have a width in the gate length direction that is greater than the gate length of each gate electrode.

First Auxiliary Pattern Electrode 58

Transistor forming regions 102 and 103 are arranged on respective sides of first auxiliary pattern electrode 58. Here, transistor forming regions 102 and 103 are displaced or offset from each other in the gate width direction. First auxiliary pattern electrode 58 has ends in the gate width direction extending beyond respective imaginary lines that are defined by respective ends of gate electrodes provided in transistor forming regions 102 and 103 (i.e., the two-dotted, dashed lines defining the transistor forming regions in FIG. 3).

First auxiliary pattern electrode 58 is arranged to have the same gate length as each gate electrode. Further, it is provided at a position ensuring that its distance from the closest gate electrode in respective transistor forming region 102, 103 becomes equal to the pitch in which the gate electrodes in transistor forming regions 102 and 103 are arranged in the gate length direction.

Function and Effect

According to the standard cell having the configuration as described above, even when transistor forming regions 102 and 103 are provided in the gate length direction within one cell frame 21, provision of first auxiliary pattern electrode 58 allows the same functions and effects as in the first embodiment to be realized.

Figure 4:
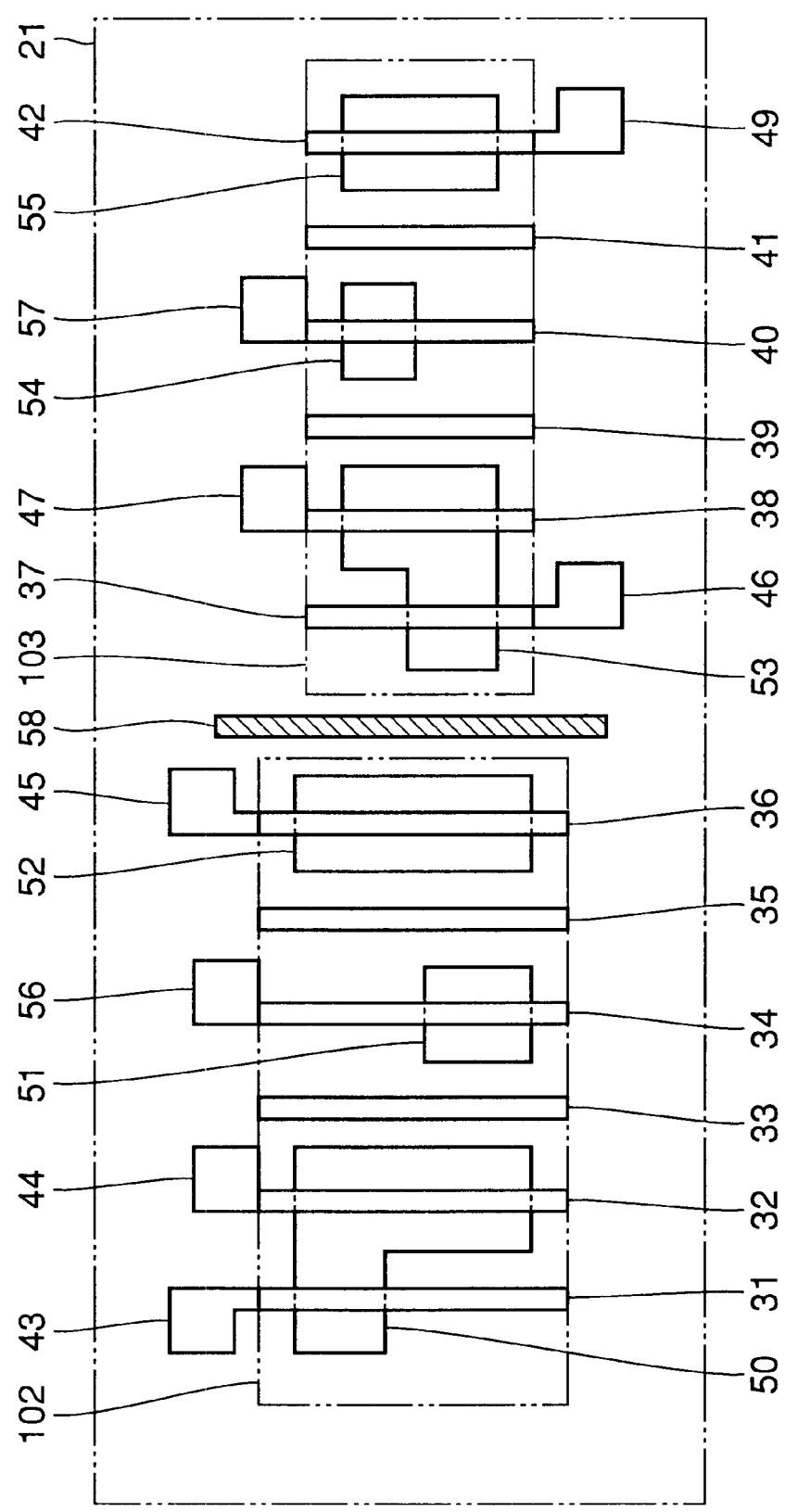
FIG. 4 is a top plan view schematically showing another standard cell structure according to the third embodiment.

Further, by arranging two transistor forming regions in the gate length direction as in the present embodiment, it becomes possible, for example, to form PMOS transistors and nMOS transistors separately from each other in respective regions, so that the layout is simplified. In addition, as shown in FIG. 4, it is possible to independently set different transistor sizes in the two transistor forming regions.

Although the present embodiment has been described above taking the case where two transistor forming regions are arranged in the gate length direction, even if three or more such regions are provided, the same functions and effects can be realized.

Further, by combining the standard cell structure of the present embodiment with that of the second embodiment, it becomes possible to form an arbitrary number of transistor forming regions having different gate electrode sizes both in the gate width and gate length directions. This allows more precise size determination of gate electrodes. Thus, a semiconductor integrated circuit operating more rapidly and consuming less power can be implemented.

Although the respective ends of first auxiliary pattern electrode 58 in the gate width direction are made to extend to the outside of the imaginary lines defined by the respective ends of gate electrodes in transistor forming regions 102 and 103 in the case described above, they can be aligned on these imaginary lines, respectively. Even in such a case, the same functions and effects can be achieved.

Fourth Embodiment

Configuration

Figure 5:
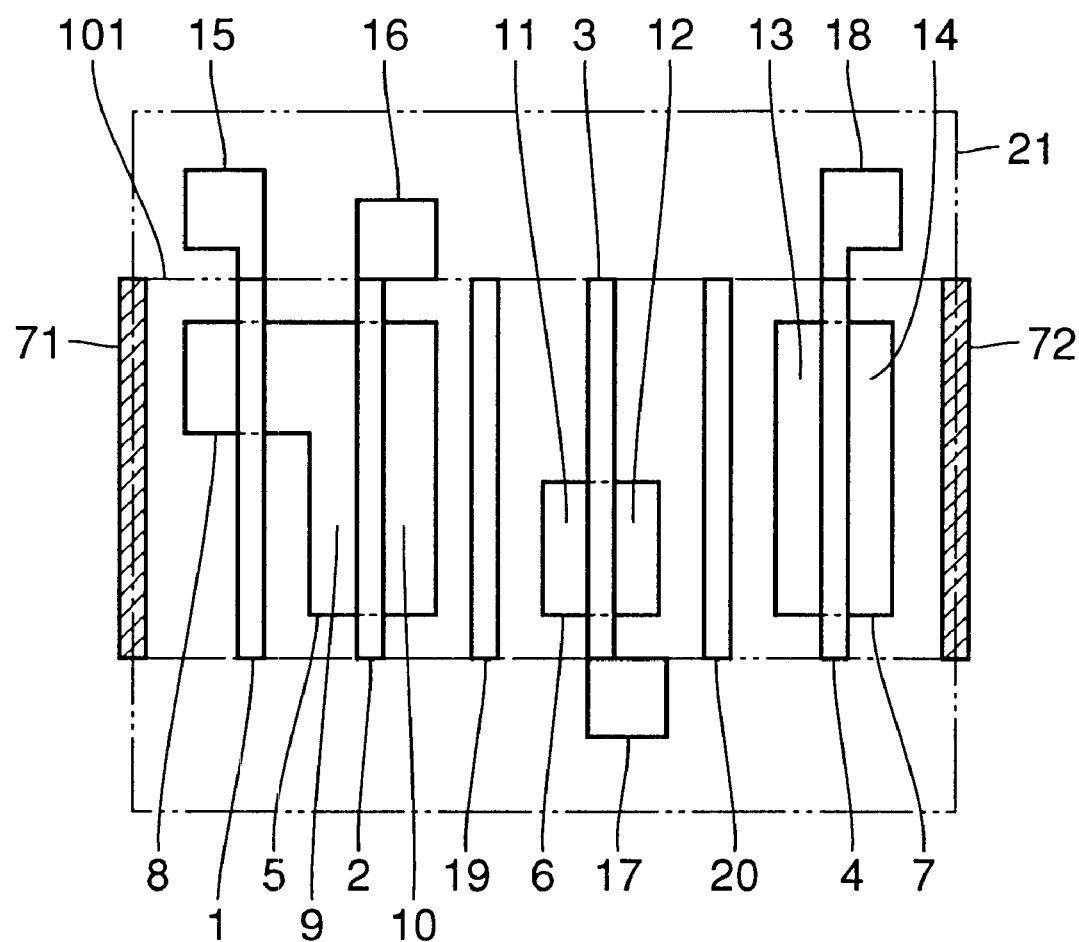
FIGS. 5–10 are top plan views schematically showing standard cell structures according to fourth through ninth embodiments, respectively, of the present invention.

FIG. 5 shows a semiconductor device according to the fourth embodiment. Referring to FIG. 5, the standard cell structure according to the present embodiment is basically the same as that of the first embodiment shown in FIG. 1, except that second auxiliary pattern electrodes 71, 72 are provided on respective sides in the gate length direction at the outside of the standard cell structure shown in the first embodiment.

Second auxiliary pattern electrodes 71, 72 each have the same gate length as, and are arranged in the same pitch in the gate length direction as, the gate electrodes provided in transistor forming region 101. Further, second auxiliary pattern electrodes 71, 72 have respective ends in the gate width direction that extend to and align on the imaginary lines shared with the gate electrodes (the two-dotted, dashed line defining transistor forming region 101 in FIG. 4).

Function and Effect

According to the standard cell with the configuration as described above, upon construction of the semiconductor integrated circuit by a combination of such standard cells, even if one standard cell does not have a neighboring standard cell and thus the outermost gate electrode of the standard cell does not have a neighboring gate electrode, the auxiliary pattern electrode functions as such neighboring gate electrode for the outermost gate electrode within the standard cell. This prevents variation in finished dimension of the gate electrodes. As a result, the same functions and effects as in the first embodiment can be obtained.

Fifth Embodiment

Configuration

Figure 6:
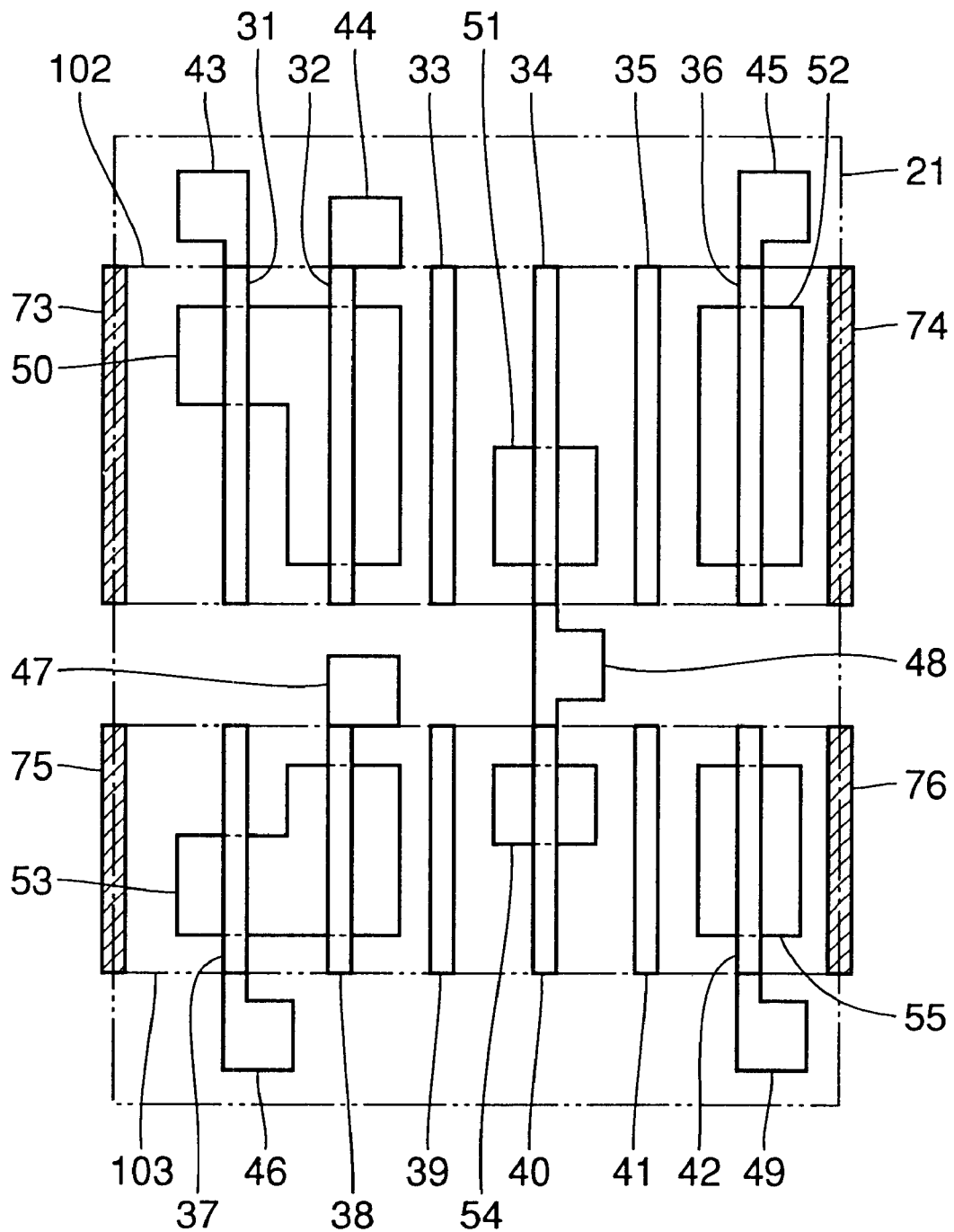

FIG. 6 shows a semiconductor device according to the fifth embodiment. Referring to FIG. 6, the standard cell structure according to the present embodiment is a combination of the structure of the second embodiment shown in FIG. 2 and the structure of the fourth embodiment shown in FIG. 5. In FIG. 6, portions the same as in the structure of the second embodiment are denoted by the same reference characters, and detailed description thereof will not be repeated.

Outside in the gate length direction of first gate electrodes 31, 36 in transistor forming region 102, second auxiliary pattern electrodes 73, 74 are provided, respectively. Second auxiliary pattern electrodes 73, 74 each have the same gate length as the gate electrodes provided in transistor forming region 102, and are arranged in the same pitch in the gate length direction as those gate electrodes. Further, respective ends in the gate width direction of second auxiliary pattern electrodes 73, 74 are made to align on the imaginary lines shared with the respective ends of the gate electrodes (the two-dotted, dashed line defining transistor forming region in FIG. 6).

Similarly, outside in the gate length direction of first gate electrodes 37, 42 of transistor forming region 103, second auxiliary pattern electrodes 75, 76 are provided, respectively. Second auxiliary pattern electrodes 75, 76 each have the same gate length as the gate electrodes in transistor forming region 103, and are arranged in the same pitch in the gate length direction as those gate electrodes. Further, respective ends in the gate width direction of second auxiliary pattern electrodes 75, 76 are made to align on the imaginary lines shared with the respective ends of the gate electrodes (the two-dotted, dashed line defining transistor forming region 103 in FIG. 6).

Function and Effect

According to the standard cell of the configuration as described above, even if a plurality of transistor forming regions are provided in the gate width direction within one standard cell, variation in finished dimension of gate electrodes can be prevented. As a result, the same functions and same effects as in the second and fourth embodiments can be obtained.

Sixth Embodiment

Configuration

Figure 7:
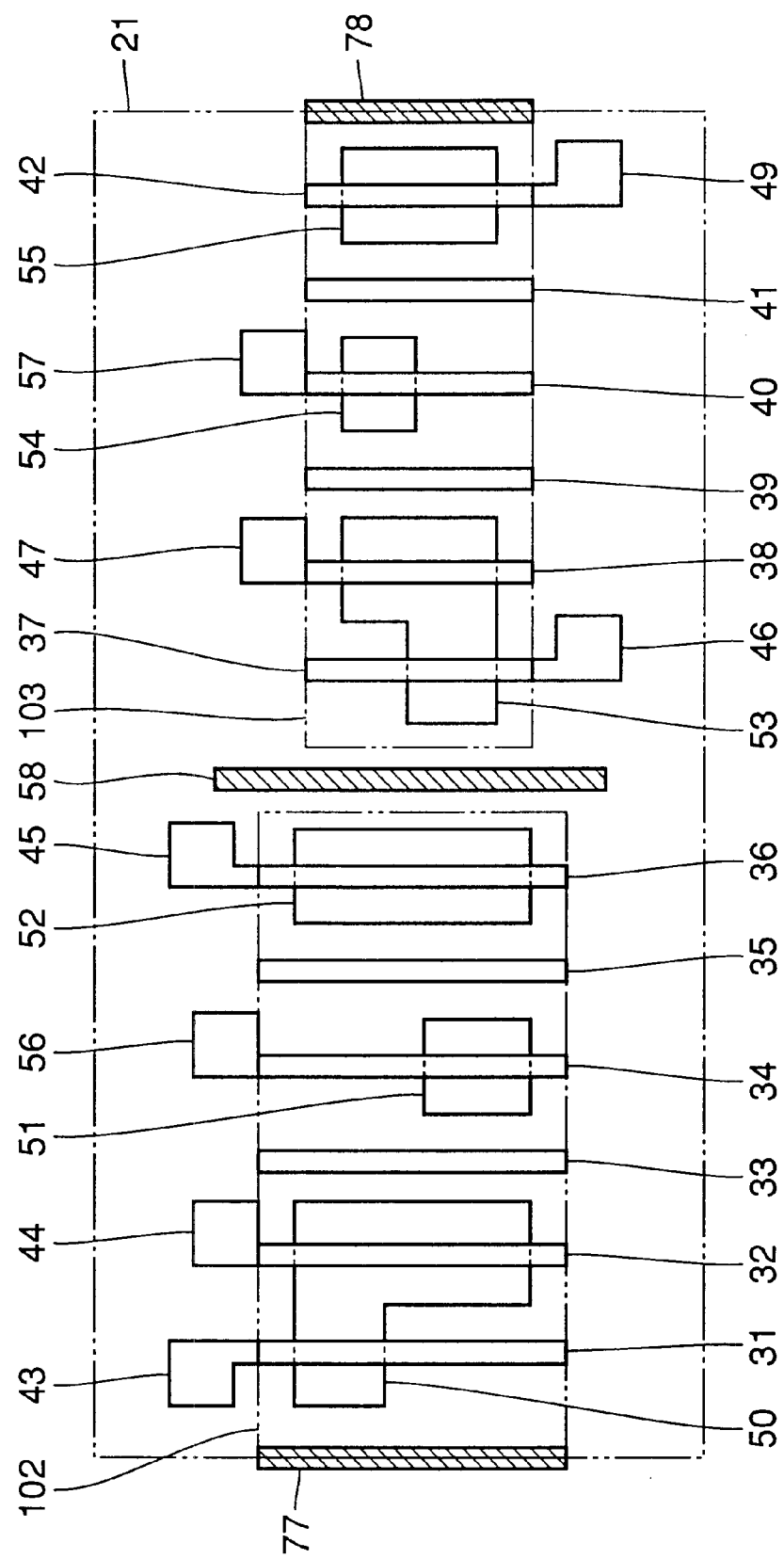

FIG. 7 shows a semiconductor device according to the sixth embodiment. Referring to FIG. 7, the standard cell structure according to the present embodiment is a combination of the structure of the third embodiment shown in FIG. 4 and the structure of the fourth embodiment shown in FIG. 5. In FIG. 7, portions the same as in the structure of the third embodiment are denoted by the same reference characters and detailed description thereof is not repeated.

Outside in the gate length direction of first gate electrode 31 in transistor forming region 102, a second auxiliary pattern electrode 77 is provided. Second auxiliary pattern electrode 77 has the same gate length as the gate electrodes provided in transistor forming region 102, and is arranged in the same pitch in the gate length direction as those gate electrodes. Further, respective ends in the gate width direction of second auxiliary pattern electrode 77 are aligned on the imaginary lines defining the respective ends of the gate electrodes (two-dotted, dashed line delimiting transistor forming region 102 in FIG. 7).

Similarly, outside in the gate length direction of first gate electrode 42 in transistor forming region 103, another second auxiliary pattern electrode 78 is provided. Second auxiliary pattern electrode 78 has the same gate length as, and is arranged in the same pitch in the gate length direction as, the gate electrodes provided in transistor forming region 103. Further, respective ends in the gate width direction of second auxiliary pattern electrode 78 extend to and are aligned on the imaginary lines defining the respective ends of the gate electrodes (two-dotted, dashed line delimiting transistor forming region 103 in FIG. 7).

Function and Effect

According to the standard cell of the configuration as described above, even if a plurality of transistor forming regions are placed in the gate length direction in one standard cell, variation in finished dimension of gate electrodes is prevented. As a result, the same functions and effects as in the third and fourth embodiments can be realized.

Seventh Embodiment

Configuration

Figure 8:
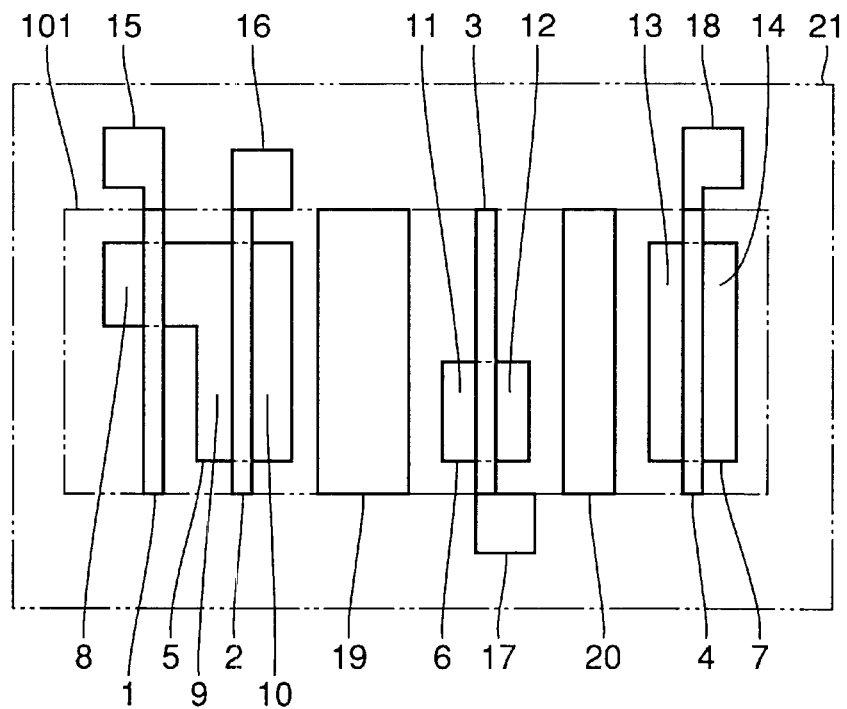

FIG. 8 shows a semiconductor device according to the seventh embodiment. Referring to FIG. 8, the standard cell structure of the present embodiment differs from the standard cell structure of the first embodiment shown in FIG. 1 in that second gate electrodes 19, 20, which have been additionally provided for the purposes of regular arrangement of gate electrodes, are increased in size in the gate length direction. Further, distances between opposing sidewalls of adjacent gate electrodes in the gate length direction are made all same. Otherwise, the configuration of the present embodiment is identical to that of the first embodiment, and same or corresponding portions are denoted by same reference characters and detailed description thereof is not repeated.

Function and Effect

Generally in a standard cell including many interconnections, gate electrodes may be placed at some distance from each other to conform to upper layer interconnections. To place such gate electrodes in a completely regular manner as in the standard cell structure of the first embodiment, new gate electrodes must be added for realization of such regular disposition, and thus, the area of the standard cell region will increase by the added gate electrodes in units of the gate pitch.

Conversely, according to the standard cell structure of the present embodiment, all that is needed for realizing the same distances between the opposing sidewalls of the adjacent gate electrodes in the gate length direction, is to change the widths in the gate length direction of the added second gate electrodes 19, 20. Thus, it becomes possible to minimize the increase of the plane area of the standard cell.

Further, according to the standard cell structure of the present embodiment, the gate electrodes are not shaped completely regularly as in the first embodiment. However, with respect to the first gate electrodes being used in the transistors, adjacent gate electrodes are provided such that every distance between their opposing sidewalls becomes equal. Thus, variation in finished dimension of the first gate electrodes can be substantially eliminated, so that a semiconductor integrated circuit operating at high speed and consuming less power can be realized.

The present embodiment has been described above taking the case to be applied to the standard cell structure of the first embodiment. However, the present embodiment can also be applied to any standard cell structures of the second through sixth embodiments and, in any case, the same functions and effects can be realized.

Eighth Embodiment

Configuration

Figure 9:
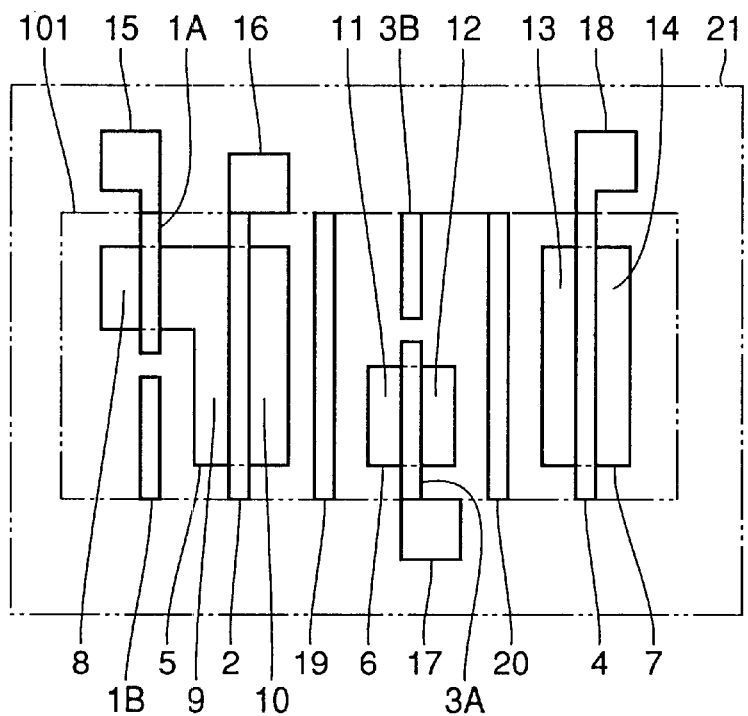

FIG. 9 shows a semiconductor device of the eighth embodiment. Referring to FIG. 9, the standard cell structure of the present embodiment is different from the standard cell structure of the first embodiment shown in FIG. 1 in that first gate electrodes 15, 17 are divided into two portions, i.e., gate electrodes 1A and 1B, 3A and 3B, respectively, which correspond to the portions related to active regions 5, 6, and the remaining portions. Otherwise, the configuration of the present embodiment is the same as that of the first embodiment, and therefore, same or corresponding portions are denoted by same reference characters, and detailed description thereof is not repeated.

Function and Effect

According to the standard cell of the configuration as described above, the transistors consisting of gate electrodes 1A, 3A, respectively, only have the necessary gate widths. Thus, parasitic capacitance is reduced. As a result, a standard cell with a high driving speed and low power consumption is realized.

Further, according to the standard cell of the configuration as described above, although each gate electrode in transistor forming region 101 is not perfectly uniform in shape, with respect to almost all the gate electrodes, their neighboring gate electrodes are placed at almost equal distances. Thus, variation in finished dimension of the gates is approximately eliminated. As a result, a semiconductor integrated circuit allowing a higher driving speed and consuming less power can be implemented.

The present embodiment has been described above taking the case being applied to the standard cell structure of the first embodiment. However, the present embodiment is also applicable to any structure of the second through seventh embodiments. In any case, the same functions and effects can be realized.

Ninth Embodiment

Figure 10:
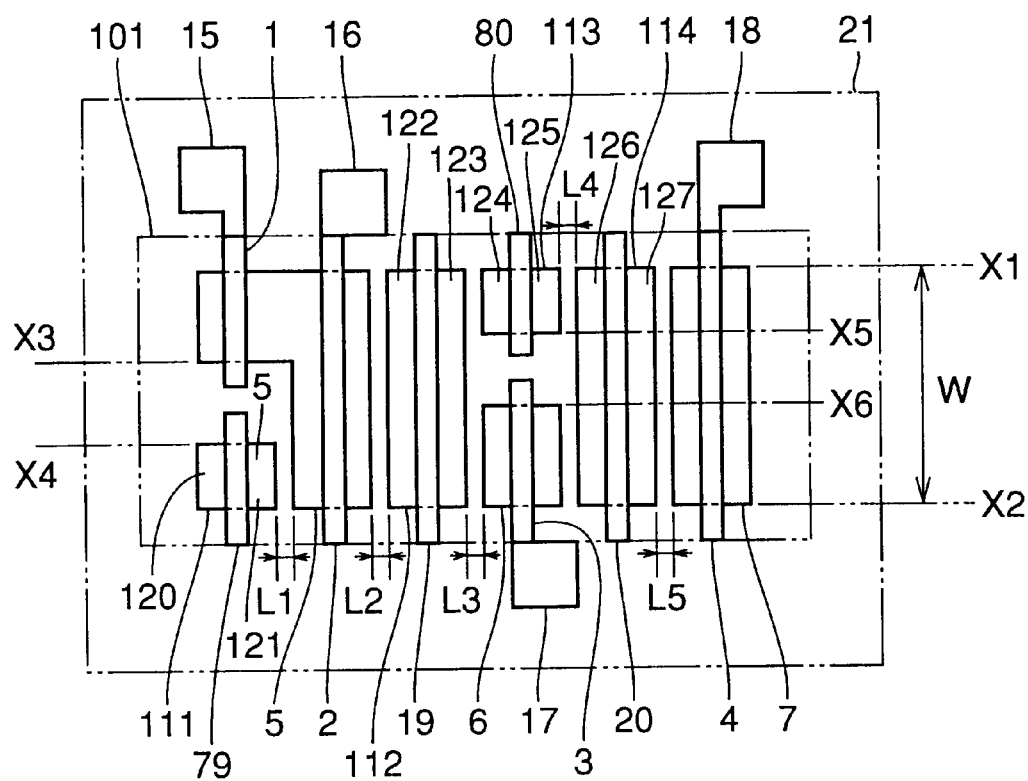

FIG. 10 shows a semiconductor device according to the ninth embodiment. Referring to FIG. 10, the standard cell structure of the present embodiment increases pattern regularity of the active regions as compared to the structure of the eighth embodiment. [Specifically, an active region 111 is provided below first gate electrode 79; an active region 112 below second gate electrode 19; an active region 113 below first gate electrode 80; and an active region 114 is provided below second gate electrode 20.] Specifically, an active region 111 is provided below first gate electrode 79, which has source/drain regions 120, 121 sandwiching the portion immediately beneath gate electrode 79 therebetween. Similarly, an active region 112 is provided below gate electrode 19, which has source/drain regions 122, 123 sandwiching the portion immediately beneath gate electrode 19 therebetween. An active region 113 is provided below gate electrode 80, which has source/drain regions 124, 125 sandwiching the portion immediately beneath gate electrode 80 therebetween. An active region 114 is provided below gate electrode 20, which has source/drain regions 126, 127 sandwiching the portion immediately beneath gate electrode 20 therebetween.

The distance (L1) between active region 111 and active region 5, the distance (L2) between active region 5 and active region 112, the distance (L3) between active region 112 and active regions 6, 113, the distance (L4) between active regions 6, 113 and active region 114, and the distance (L5) between active region 114 and active region 7 are all set equal to each other (L1=L2=L3=L4=L5). Further, every region sandwiched by neighboring active regions (i.e., the region defined by each distance L1–L5) is located within a respective region sandwiched by two gate electrodes adjacent to each other.

Active regions 5, 112, 113, 114 and 7 have one ends delimiting their boundaries in the gate width direction that are aligned on a common imaginary line X1, and the opposite ends that are aligned on another common imaginary line X2.

Further, a portion of active region 5 corresponding to gate 1 has opposite ends delimiting its boundaries (X1 and X3) in the width direction Longitudinal direction) of gate 1. Active region 111 has opposite boundaries (X2 and X4) in the width (longitudinal) direction of gate 79. Active region 113 has opposite boundaries (X1 and X5) in the width longitudinal) direction of gate 80. Active region 6 has opposite boundaries (X2 and X6) in the width (longitudinal) direction of gate 3.

Otherwise, the configuration of the present embodiment is the same as that of the first embodiment, and same portions are denoted by same reference characters and detailed description thereof is not repeated.

Function and Effect

Generally in the active regions, as in the case of the gate electrodes, an increase in irregularity of the pattern is likely to increase variation in finished dimension thereof. If the pattern dimensions of the active regions vary both in the gate width and gate length directions, as shown in FIG. 8, finished sizes of the active regions become uneven. As a result, the transistor size will diverse from the designed value, so that desired performance cannot be achieved. According to the standard cell structure of the present embodiment, however, it becomes possible to increase the pattern regularity of the active regions, so that the desired performance becomes achievable.

Tenth Embodiment

Configuration

Figure 11:
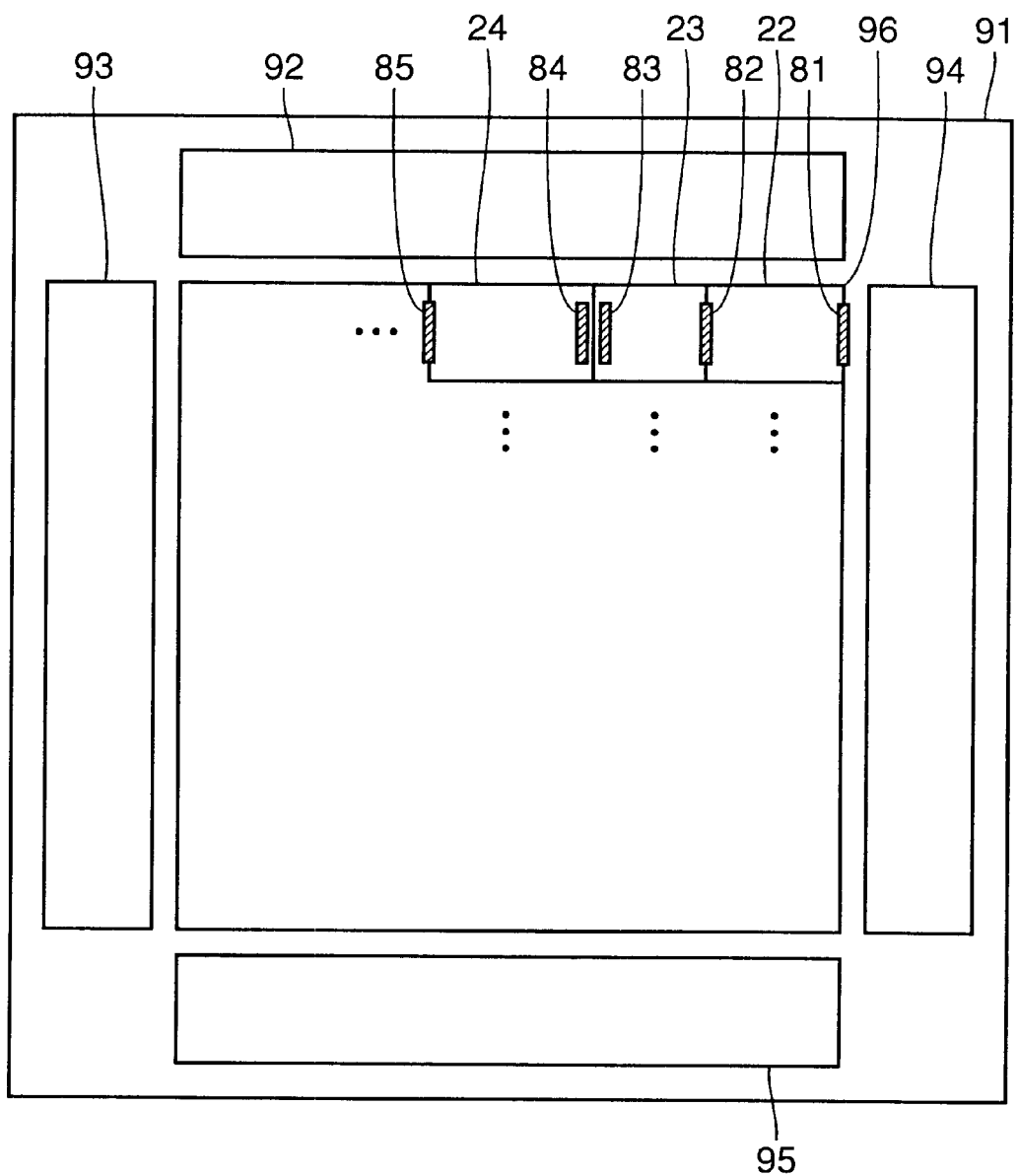
FIGS. 11 and 12 are top plan views schematically showing LSI chip structures according to tenth and eleventh embodiments, respectively, of the present invention.

FIG. 11 shows a semiconductor device of the tenth embodiment. Referring to FIG. 11, the structure of the semiconductor device according to the present embodiment is the case where an LSI chip is configured using the standard cell having a configuration as in the first embodiment. LSI chip 91 includes peripheral circuit regions 92–95 for disposition of pads and input/output buffers, and a cell array region 96 in which standard cells are combined to configure a logic circuit. In cell array region 96, a plurality of standard cells 22–24, each having the configuration as in the first embodiment, are arranged in rows and columns. Placed between adjacent standard cells are second auxiliary pattern electrodes 81–85.

Specifically, distances between standard cells 22–24 in the gate length direction are adjusted to ensure that the gate electrodes within standard cells 22–24 are arranged regularly through the entire cell array region. At this time, second auxiliary pattern electrodes 81–85 are added as necessary so as to realize such regular arrangement of the gate electrodes.

Second auxiliary pattern electrodes 81–85 may each have a gate length the same as that of the gate electrodes being used for the transistors in standard cells 22–24. Alternatively, they may each have a greater gate length than those gate electrodes if it helps equalize the distances between adjacent gate electrodes, as in the case of second gate electrodes 19, 20 shown in FIG. 8.

The gate widths of secondary auxiliary pattern electrodes 81–85 are determined such that respective ends of second auxiliary pattern electrodes 81–85 extend exactly to or beyond the imaginary lines being defined by respective ends of the gate electrodes used in the transistors in standard cells 22–24.

Function and Effect

According to the semiconductor integrated circuit with the configuration as described above, the standard cells each having the configuration of the first embodiment can be used to realize the regular arrangement of the gate electrodes.

Eleventh Embodiment

Configuration

Figure 12:
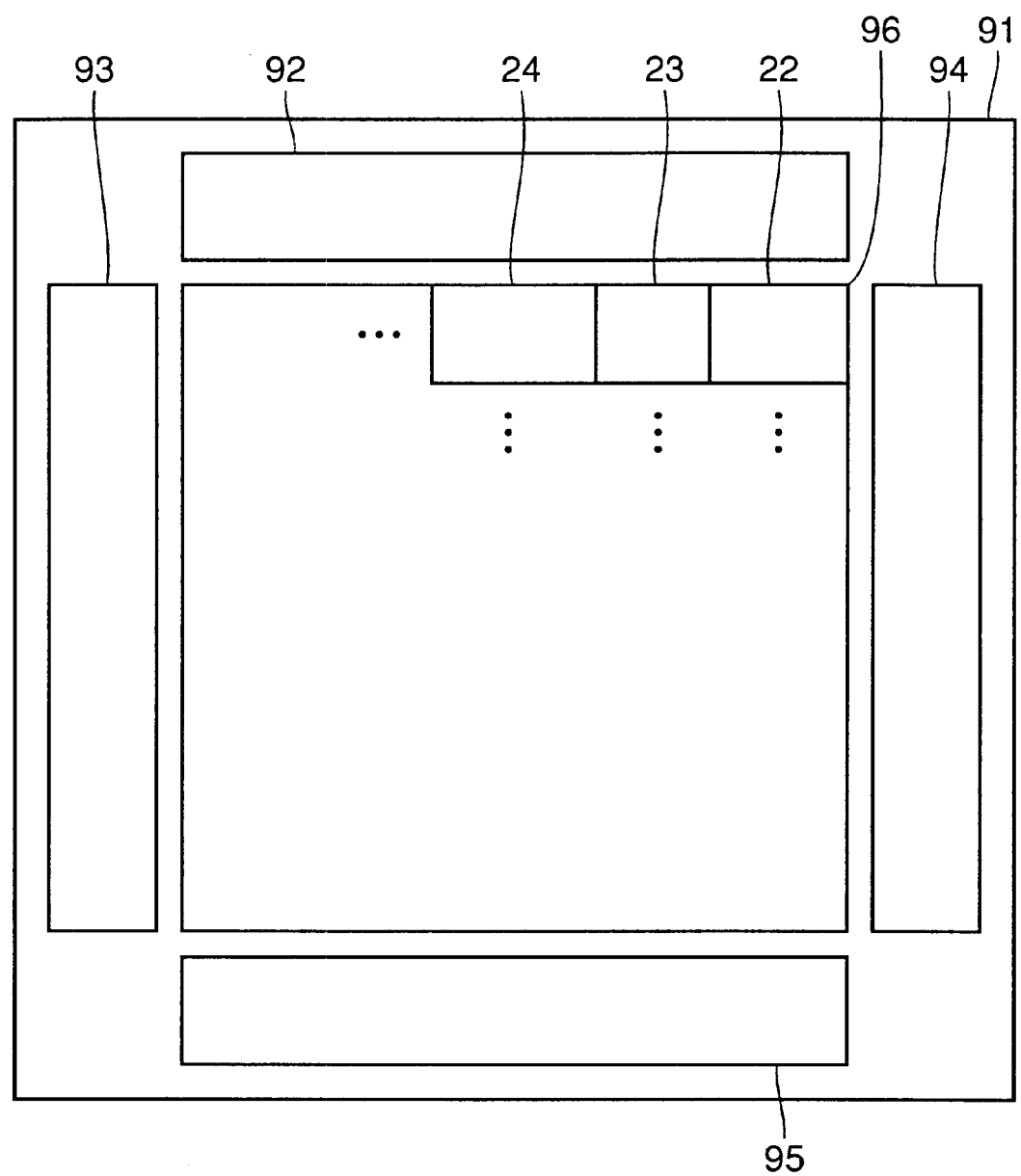
Figure 13:
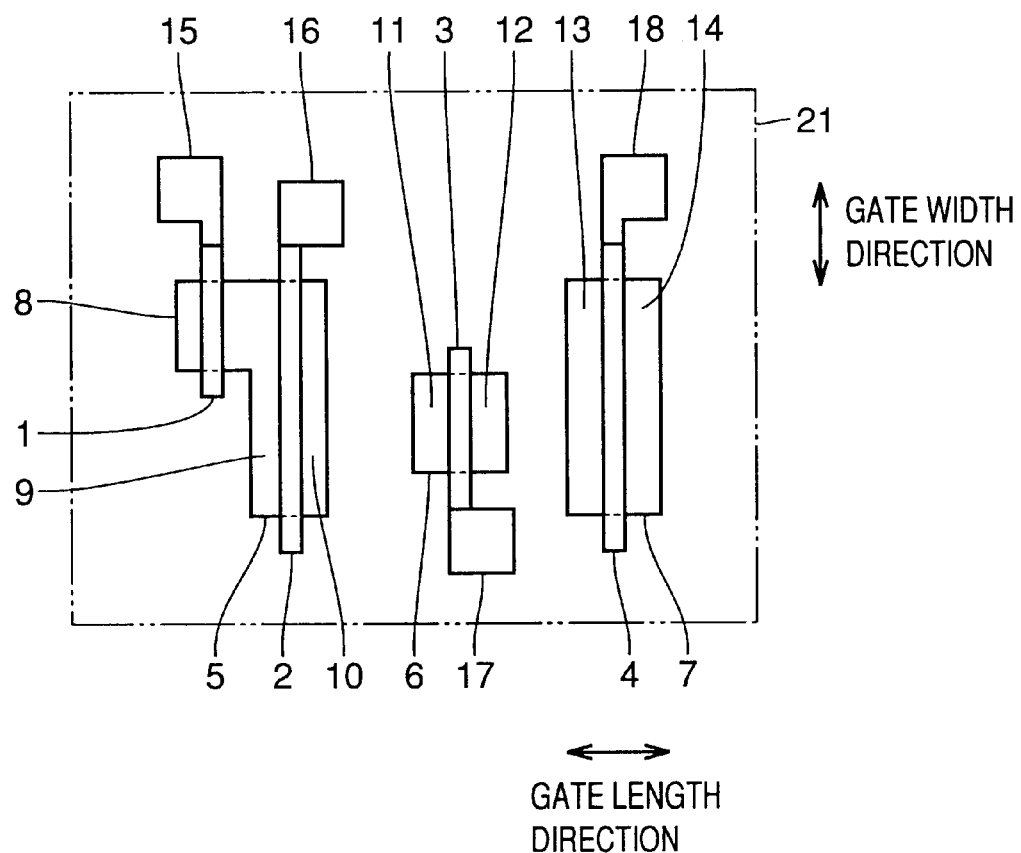
FIG. 13 is a top plan view schematically showing a conventional standard cell structure.

The semiconductor device according to the eleventh embodiment is shown in FIG. 12. Referring to FIG. 12, the structure of the semiconductor device of the present embodiment corresponds to the case in which standard cells each having a configuration equivalent to that of the fourth embodiment are used to form an LSI chip. The basic structure of the LSI chip is the same as the configuration according to the tenth embodiment.

The standard cell according to the fourth embodiment already has second auxiliary pattern electrodes 71 and 72 formed on its respective boundaries with neighboring standard cells, as shown in FIG. 5. Thus, second auxiliary pattern electrodes 81–85 employed in the tenth embodiment are unnecessary.

For disposition of standard cells 22–24, there are several possible ways. One way is to align edges of two standard cells so that second auxiliary pattern electrodes 71 and 72 as in FIG. 5 are overlaid one on another, like standard cells 22 and 23 as shown in FIG. 11. Another way is to place second auxiliary pattern electrodes 71 and 72 spaced apart from each other by the gate pitch, like standard cells 23 and 24 as shown in FIG. 11. In any case, it is possible to regularly arrange the gate electrodes through the entire cell array region.

Function and Effect

According to the semiconductor integrated circuit with the configuration as described above, the standard cells each having the configuration of the fourth embodiment can be used to realize the regular arrangement of the gate electrodes.

The tenth and eleventh embodiments have been described above taking the case in which the standard cell structures as disclosed in the first and fourth embodiments, respectively, are applied thereto. However, the same functions and effects can be realized even if the standard cell structures according to the other embodiments are applied.

As explained above, according to the semiconductor device of the present invention, it becomes possible to prevent variation in finished dimension of gate electrodes and active regions. Thus, a semiconductor device operating at high speed and consuming less power can be accomplished.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a transistor forming region having a plurality of source/drain regions formed on a semiconductor substrate, and a plurality of gate electrodes arranged in a first direction, each having a gate width direction that matches a second direction orthogonal to said first direction; and
    a plurality of field effect transistors each formed of one of said plurality of gate electrodes and two of said plurality of source/drain regions;
    said plurality of field effect transistors having at least two kinds of such field effect transistors that are different in active region widths corresponding to lengths along the second direction of said plurality of source/drain regions, and each gate width of said plurality of gate electrodes being made at least equal to a longest one of said active region widths.

2. The semiconductor device according to claim 1, wherein each of said plurality of gate electrodes is provided such that every distance between opposing sidewalls of adjacent said gate electrodes is approximately equal.

3. The semiconductor device according to claim 1, wherein each of said plurality of gate electrodes has a same gate length.

4. The semiconductor device according to claim 3, including a plurality of said transistor forming regions, said transistor forming regions being arranged side by side in said first direction, and a first auxiliary pattern electrode provided between said transistor forming regions, said first auxiliary pattern electrode having a same gate length as said gate electrodes, and being provided at a position ensuring that respective distances between said first auxiliary pattern electrode and closest said gate electrodes in respective said transistor forming regions each become equal to a pitch of said gate electrodes in the gate length direction, and respective ends of said first auxiliary pattern electrode in said second direction being arranged to align with or extend beyond respective ends of said gate electrodes in said second direction.

5. The semiconductor device according to claim 3, wherein a second auxiliary pattern electrode is provided at an outside, in said first direction, of an outermost one of said gate electrodes in said transistor forming region on its side not facing another said transistor forming region, said second auxiliary pattern electrode having a same gate length as said gate electrodes and being provided in a same pitch as said gate electrodes in said first direction, and respective ends in said second direction of said second auxiliary pattern electrode being arranged such that they extend to or beyond respective ends in said second direction of said gate electrodes.

6. The semiconductor device according to claim 1, including a plurality of said transistor forming regions, said transistor forming regions being arranged side by side in said second direction.

7. The semiconductor device according to claim 1, wherein a gate interconnection portion is provided at an end in said second direction of at least one of said gate electrodes.

8. The semiconductor device according to claim 1, wherein said plurality of gate electrodes include at least one first gate electrode that is electrically independent, and at least one second gate electrode that is connected to an interconnection portion having a width in the first direction that is greater than a length in the first direction of said second gate electrode.

9. The semiconductor device according to claim 1, wherein said gate electrodes within said transistor forming region include a first gate electrode that contributes to an operation of the semiconductor device and a second gate electrode that does not contribute to the operation of the semiconductor device.

10. The semiconductor device according to claim 1, wherein at least one of said gate electrodes is formed of one member from one end to another end in said second direction.

11. The semiconductor device according to claim 1, wherein at least one of said gate electrodes is divided into at least two parts from one end to another end in said second direction.

12. The semiconductor device according to claim 1, wherein said plurality of source/drain regions include a plurality of pairs of adjacent source/drain regions having their boundaries facing with each other in the first direction, said boundaries of each said pair of source/drain regions are provided between adjacent said gate electrodes, and distances between said boundaries of said pairs of adjacent source/drain regions are all set equal.

13. The semiconductor device according to claim 1, wherein said transistor forming region is formed in a standard cell.

14. A semiconductor device, characterized in that a semiconductor integrated circuit is formed by arranging a plurality of integrated circuits in rows and columns, each integrated circuit including a transistor forming region having a plurality of source/drain regions formed on a semiconductor substrate, and a plurality of gate electrodes arranged in a first direction, each having a gate width direction that matches a second direction orthogonal to said first direction, and a plurality of field effect transistors each formed of one of said plurality of gate electrodes and two of said plurality of source/drain regions, said plurality of field effect transistors having at least two kinds of such field effect transistors that are different in active region widths corresponding to lengths along the second direction of said plurality of source/drain regions, and each gate width of said plurality of gate electrodes being made at least equal to a longest one of the active region widths.

15. The semiconductor device according to claim 1, wherein said plurality of gate electrodes include at least one gate electrode which does not contribute to the operation of said semiconductor device, said device further comprising an active layer formed on the semiconductor substrate below said at least one gate electrode.

* * * * *